United States Patent
Kallupalathinkal Chandran et al.

(10) Patent No.: US 11,575,081 B2
(45) Date of Patent: Feb. 7, 2023

(54) MEMS STRUCTURES AND METHODS OF FORMING MEMS STRUCTURES

(71) Applicant: VANGUARD INTERNATIONAL SEMICONDUCTOR SINGAPORE PTE. LTD., Singapore (SG)

(72) Inventors: Bevita Kallupalathinkal Chandran, Singapore (SG); Jia Jie Xia, Singapore (SG); Tze Sheong Neoh, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 681 days.

(21) Appl. No.: 16/695,313

(22) Filed: Nov. 26, 2019

(65) Prior Publication Data
US 2021/0159387 A1    May 27, 2021

(51) Int. Cl.
*H01L 41/08*    (2006.01)
*C01B 21/072*    (2006.01)

(52) U.S. Cl.
CPC ........ *H01L 41/0815* (2013.01); *C01B 21/072* (2013.01)

(58) Field of Classification Search
CPC .......................... H01L 41/0815; C01B 21/072
See application file for complete search history.

(56) References Cited

U.S. PATENT DOCUMENTS

| 7,758,979 B2 | 7/2010 | Akiyama et al. |
| 10,214,415 B1 * | 2/2019 | Griffin .................. B81B 7/0019 |
| 2008/0099860 A1 * | 5/2008 | Wuertz ............... B81C 1/00246 |
| | | 257/415 |
| 2017/0104465 A1 | 4/2017 | Burgess et al. |

OTHER PUBLICATIONS

Parsapour et al., "Ex-situ AlN seed layer for (0001)-textured Al0.84Sc0.16N thin films grown on SiO2 substrates", 2017 IEEE International Ultrasonics Symposium (IUS), 2017, 4 pages, IEEE.
Fichtner et al., "Identifying and overcoming the interface originating c-axis instability in highly Sc enhanced AlN for piezoelectric micro-electromechanical systems", Journal of Applied Physics, 2017, 8 pages, 122, 035301, AIP Publishing.

* cited by examiner

*Primary Examiner* — J. San Martin
(74) *Attorney, Agent, or Firm* — Winston Hsu

(57) ABSTRACT

A MEMS structure may include a substrate, a first metal layer arranged over the substrate, an aluminum nitride layer at least partially arranged over the first metal layer and a second metal layer including one or more patterns arranged over the aluminum nitride layer. The first metal layer may include an electrode area configured for external electrical connection and one or more isolated areas configured to be electrically isolated from the electrode area and further configured to be electrically isolated from external electrical connection. Each pattern of the second metal layer may be arranged to at least partially overlap with one of the isolated area(s) of the first metal layer.

20 Claims, 8 Drawing Sheets

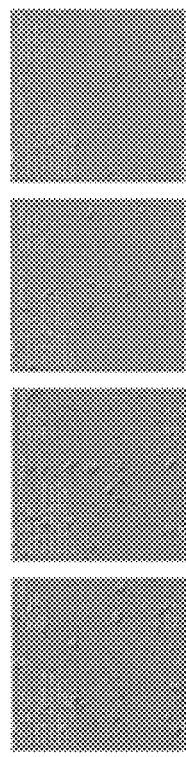
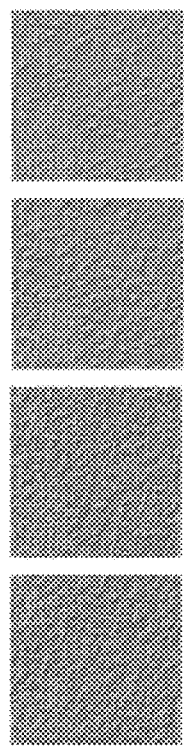

MEMS STRUCTURES AND METHODS OF FORMING MEMS STRUCTURES

TECHNICAL FIELD

The present disclosure relates generally to microelectromechanical (MEMS) structures, such as MEMS structures including one or more piezoelectric devices, and methods of forming these MEMS structures.

BACKGROUND

Due to its dielectric properties and chemical stability, aluminum nitride (AlN) has been widely used in several applications. For example, AlN is often used as a piezoelectric material for MEMS applications. The piezoelectric devices containing AlN are in turn used in apparatuses such as mobile phones. AlN layers are included in many MEMS structures and may sometimes, include metal additives such as scandium (Sc) to improve certain properties of the AlN layers. For example, adding scandium to the AlN layers can help improve the piezoelectric properties of these layers and in turn, improve the performance of the piezoelectric devices containing these layers. This is because scandium aluminum nitride (ScAlN) layers generally have a higher piezoelectric constant than pure AlN layers, and this piezoelectric constant increases as the percentage of scandium in the AlN layer increases. For example, a ScAlN layer with approximately fifty percent scandium can have a piezoelectric constant about 10 times higher than a pure AlN film.

However, AlN layers containing scandium tend to include crystalline defects caused by ScAlN crystals growing in directions different from the (002) c-axis orientation, and the density of such defects increases as the percentage of scandium increases. The crystalline defects can detrimentally affect the quality of the AlN layers. In addition, the defects often protrude beyond the surfaces of the AlN layers and this can cause difficulties in the patterning of subsequent layers over the AlN layers. Occasionally, the extent of the defects' protrusion beyond an AlN layer's surface can be more than one-tenth of the AlN layer's thickness. Thus, patterned areas over an AlN layer with crystalline defects are often distorted, especially if these areas have thicknesses less than or equal to the heights of the protrusions of the defects. In some cases, the patterned areas may include electrodes of measurement devices and the distortions in the patterned areas may result in thinning or damage to these electrodes, in turn causing erroneous measurements of electrical parameters.

Several attempts have been made to reduce the amount and density of defects in AlN layers, particularly in ScAlN layers.

For example, a dual target co-sputtering method can be used to form ScAlN layers with a lower amount of defects. In this method, scandium and aluminum are simultaneously sputtered onto a surface (e.g. a surface of a substrate) in an atmosphere including nitrogen gas. However, the dual target co-sputtering method requires individual tuning of a scandium target and an aluminum target to maintain a relatively consistent ScAlN concentration throughout the ScAlN layer. Such individual tuning of the targets is generally hard to implement and thus, it can be difficult to achieve large scale production repeatability with such a method.

In some cases, when using the dual target co-sputtering method, the amount of scandium can be reduced to reduce the amount of defects in the resulting ScAlN layers. However, reducing the amount of scandium in the AlN layers can compromise the piezoelectric properties of these layers. Another attempt to further reduce defects in ScAlN layers formed with the dual target co-sputtering method involves etching the surface on which the scandium and aluminum are to be deposited before the sputtering process. However, the additional etching increases the complexity of the fabrication process of the ScAlN layers. One other attempt to reduce defects in ScAlN layers formed with the dual target co-sputtering method involves adjusting distances between the targets and the surface during the sputtering process by for example, changing the hardware settings in the deposition chamber. However, this also increases the complexity of fabricating the ScAlN layers.

In a further example, to reduce defects in a ScAlN layer, an additional ScAlN layer is formed and the ScAlN layer is formed over this additional ScAlN layer. The additional ScAlN layer is deposited at a higher bias power as compared to the bias power used when depositing the ScAlN layer. This helps to reduce the defects in some areas of the ScAlN layer. However, the density of defects along a boundary of a donut/ring region in approximately a middle of the ScAlN layer remains high. Accordingly, a device including this approximately middle portion of the ScAlN layer tends to have a high capacitance loss. When the device is used as a piezoelectric device and the portion of the ScAlN layer is included as part of a piezoelectric cantilever in the device, there may be a higher deflection of the piezoelectric cantilever along the boundary of the donut/ring region, leading to higher yield loss for the piezoelectric device.

Another example of a method to reduce the amount of defects in a ScAlN layer involves using an AlN layer as a seed layer to grow the ScAlN layer, where an etch cleaning step may be performed on the seed layer prior to growing the ScAlN layer. However, such a method involves several additional steps to form the seed layer and perform the etch cleaning. Further, the amount of defects in the resulting ScAlN layer, although reduced, remains relatively high. In turn, the variation in the sheet resistance of an electrode formed over the ScAlN layer remains high as well.

SUMMARY

According to various non-limiting embodiments, there is provided a MEMS structure including: a substrate; a first metal layer arranged over the substrate, where the first metal layer may include an electrode area configured for external electrical connection and one or more isolated areas configured to be electrically isolated from the electrode area and further configured to be electrically isolated from external electrical connection; an aluminum nitride layer at least partially arranged over the first metal layer; and a second metal layer including one or more patterns arranged over the aluminum nitride layer, where each of the one or more patterns may be arranged to at least partially overlap with one of the one or more isolated areas.

According to various non-limiting embodiments, there is provided a method of forming a MEMS structure, the method including: providing a substrate; forming a first metal layer over the substrate, where the first metal layer may include an electrode area configured for external electrical connection and one or more isolated areas configured to be electrically isolated from the electrode area and further configured to be electrically isolated from external electrical connection; forming an aluminum nitride layer at least partially over the first metal layer; and forming a second metal layer including one or more patterns over the aluminum nitride layer, where each of the one or more patterns may be arranged to at least partially overlap with one of the one or more isolated areas.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 7A to 7D show scanning electron microscope (SEM) images of different portions of a metal layer of the MEMS structure of FIG. 4;

FIGS. 8A to 8D show SEM images of different portions of a metal layer of a MEMS structure similar to the MEMS structure of FIG. 4, but without the isolated areas.

DETAILED DESCRIPTION

Figure 1:
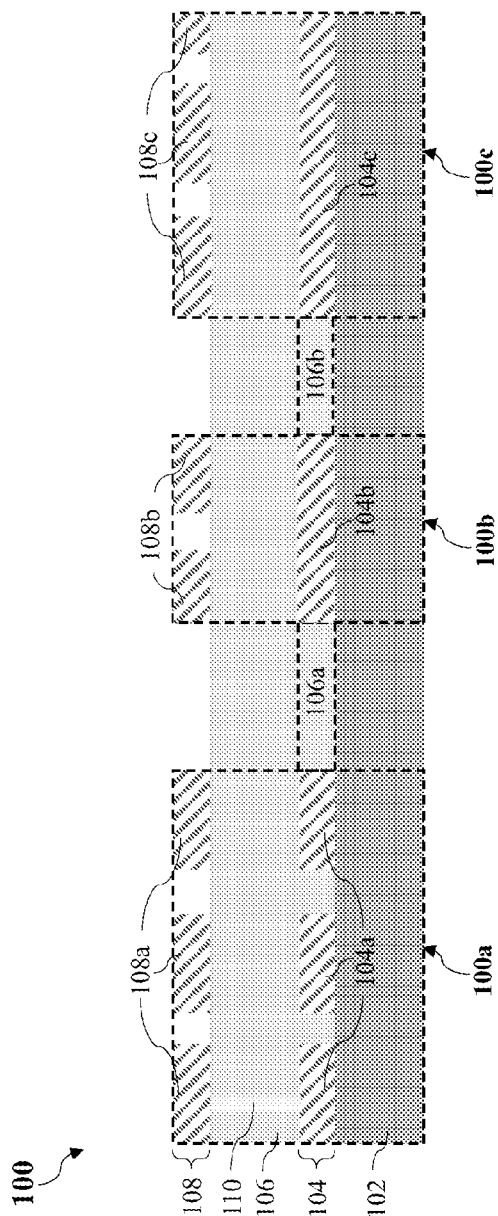
FIG. 1 shows a simplified cross-sectional view of a MEMS structure according to various non-limiting embodiments.

The embodiments generally relate to MEMS structures. More particularly, some embodiments relate to MEMS structures including one or more piezoelectric devices that may include piezoelectric cantilevers. The piezoelectric devices may be used in MEMS devices for example, but not limited to, microphones, piezoelectric micro-machined ultrasonic transducers (PMUTs), resonators, energy harvesters, pressure sensors and accelerometers.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a MEMS structure 100 according to various non-limiting embodiments. The MEMS structure 100 may include a substrate 102. In various non-limiting embodiments, the substrate 102 may be a semiconductor substrate, such as a silicon substrate. Other types of semiconductor substrates, such as a silicon germanium substrate, may also be used.

A first metal layer 104 may be arranged over the substrate 102. As shown in FIG. 1, the first metal layer 104 may include a first electrode area 104a configured for external electrical connection. The first metal layer 104 may also include a first isolated area 104b and a second isolated area 104c. The first and second isolated areas 104b, 104c may be configured to be electrically isolated from the first electrode area 104a, and in various non-limiting embodiments, may be further configured to be electrically isolated from external electrical connection. In some non-limiting embodiments, the first and second isolated areas 104b, 104c may be spaced apart and electrically isolated from each other and in other non-limiting embodiments, the first and second isolated areas 104b, 104c may be part of a single layer electrically isolated from the first electrode area 104a. In various non-limiting embodiments, the first metal layer 104 may include a metal material, such as but not limited to, molybdenum (Mo), platinum (Pt), titanium (Ti), alloys thereof, or combinations thereof.

The MEMS structure 100 may further include an aluminum nitride (AlN) layer 106 at least partially arranged over the first metal layer 104. In the non-limiting embodiment as shown in FIG. 1, the AlN layer 106 may be arranged to extend between the first isolated area 104b and the first electrode area 104a and also, between the first and second isolated areas 104b, 104c. For example, the AlN layer 106 may include a first portion 106a between the first isolated area 104b and the first electrode area 104a, and a second portion 106b between the isolated areas 104b, 104c. Accordingly, the AlN layer 106 may electrically isolate the isolated area 104b from the first electrode area 104a, and also electrically isolate the isolated areas 104b, 104c from each other. In various non-limiting embodiments, the AlN layer 106 may include further materials, such as but not limited to scandium (Sc), chromium (Cr), yttrium (Y), or combinations thereof.

The MEMS structure 100 may also include a second metal layer 108 arranged over the AlN layer 106. In various non-limiting embodiments, the second metal layer 108 may include metal material, such as but not limited to, molybdenum (Mo), platinum (Pt), titanium (Ti), alloys thereof, or combinations thereof. The first and second metal layers 104, 108 may include a same metal material in some non-limiting embodiments or may include different metal materials in other non-limiting embodiments.

The second metal layer 108 may include a second electrode area 108a arranged over the AlN layer 106 and the first electrode area 104a. A via 110 may be provided between the first and second electrode areas 104a, 108a to electrically connect these electrode areas 104a, 108a. In various non-limiting embodiments, the via 110 may include conductive material, such as, but not limited to, aluminum, copper, tungsten, alloys thereof, or combinations thereof.

In the non-limiting embodiment in FIG. 1, the first and second electrode areas 104a, 108a may include substantially similar patterns. However, in other non-limiting embodiments, the first and second electrode areas 104a, 108a may include different patterns, or one or both of these electrode areas 104a, 108a may be unpatterned (and thus, may have a substantially uniform thickness).

The second metal layer 108 may additionally include one or more patterns, for example, a first pattern 108b and a second pattern 108c in the non-limiting embodiment shown in FIG. 1. Each of the patterns 108b, 108c in the second metal layer 108 may be arranged to at least partially overlap with one of the isolated areas 104b, 104c in the first metal layer 104. For instance, in the non-limiting embodiment of FIG. 1, the first and second patterns 108b, 108c may be arranged to completely overlap with the first and second isolated areas 104b, 104c respectively. However, in alternative non-limiting embodiments, each pattern 108b, 108c may be arranged to only partially overlap with one of the isolated areas 104b, 104c. Further, in the non-limiting embodiment shown in FIG. 1, each isolated area 104b, 104c may be unpatterned and may thus, have a substantially uniform thickness. However, in alternative non-limiting embodiments, one of the isolated areas 104b, 104c or each isolated area 104b, 104c may include a pattern substantially similar to the pattern 108b, 108c of the second metal layer 108 at least partially overlapping with the isolated area 104b, 104c. For example, the isolated area 104b may include a pattern substantially similar to the pattern 108b and/or the isolated area 104c may include a pattern substantially similar to the pattern 108c.

In various non-limiting embodiments, the first electrode area 104a, the second electrode area 108a, the via 110, a part of the substrate 102 and a part of the AlN layer 106 may form a first MEMS device 100a as shown in FIG. 1. The first electrode area 104a may include a bottom electrode of the first MEMS device 100a and the second electrode area 108a may include a top electrode of the first MEMS device 100a. Accordingly, the top electrode of the first MEMS device 100a may be arranged over the bottom electrode. In various non-limiting embodiments, the first MEMS device 100a may be a piezoelectric device (for example, a piezoelectric MEMS device) and the AlN layer 106 may function as the piezoelectric layer sandwiched between the top and bottom electrodes of the piezoelectric device. In one non-limiting example, the layer 106 may be a ScAlN layer 106 that may help to improve piezoelectric properties. In various non-limiting embodiments, when a high frequency electrical signal is applied between the electrode areas 104a, 108a, the part of the AlN layer 106 between these electrode areas 104a, 108a may vibrate to produce resonance.

Referring to FIG. 1, in various non-limiting embodiments, the first isolated area 104b, the first pattern 108b, a part of the AlN layer 106 and a part of the substrate 102 may form a second MEMS device 100b. Further, the second isolated area 104c, the second pattern 108c, a part of the AlN layer 106 and a part of the substrate 102 may form a third MEMS device 100c. Each of the second and third MEMS devices 100b, 100c may be configured to perform a different function from the first MEMS device 100a. For example, the first MEMS device 100a may be a piezoelectric device, and at least one of the second and third MEMS devices 100b, 100c may be an electrical test device configured to test the sheet resistance of the electrode(s) of the first MEMS device 100a. However, in alternative non-limiting embodiments, the first, second and third MEMS devices may be configured to perform other functions, and the AlN layer 106 may include further material(s) that may improve properties of the AlN layer 106 related to these functions.

Although FIG. 1 shows three MEMS devices 100a, 100b, 100c, it is understood that the MEMS structure 100 may include the first MEMS device 100a, and only the second MEMS device 100b or only the third MEMS device 100c in alternative non-limiting embodiments. In some other alternative non-limiting embodiments, the MEMS structure 100 may include further MEMS devices. For example, the MEMS structure 100 may include at least one further MEMS device with a bottom electrode similar to the first MEMS device 100a and/or at least one further MEMS device without a bottom electrode but with an isolated area similar to that of the second and third MEMS devices 100b, 100c. In various non-limiting embodiments where the MEMS structure 100 may include multiple MEMS devices similar to the second and third MEMS devices 100b, 100c (or in other words, multiple patterns and multiple isolated areas similar to the patterns 108b, 108c and the isolated areas 104b, 104c), each pattern may be arranged to at least partially overlap with one of the isolated areas.

Figure 2:
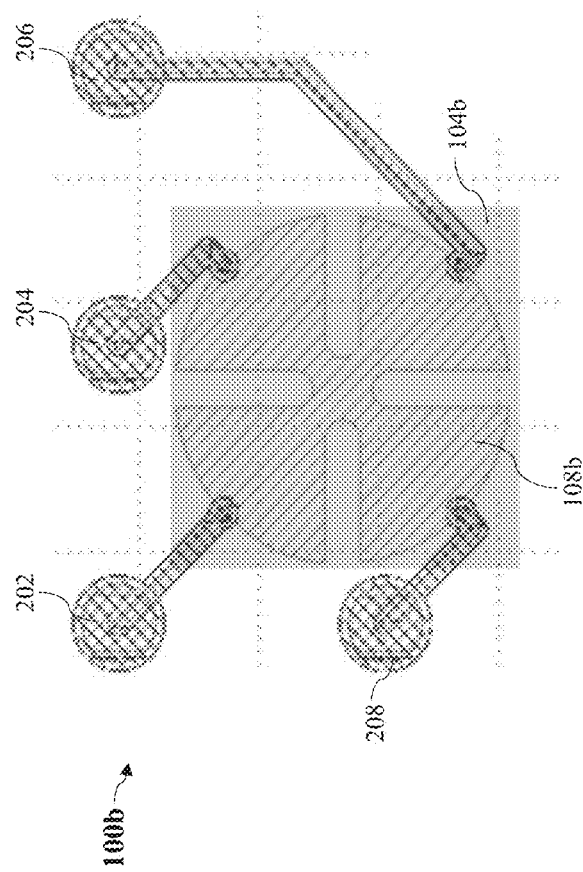
FIG. 2 shows a simplified top view of an example of a MEMS device that may be included in the MEMS structure of FIG. 1.

FIG. 2 shows a simplified top view of a non-limiting example of the second MEMS device 100b. In various non-limiting embodiments, the second MEMS device 100b may be an electrical test device and may include pads 202, 204, 206, 208 arranged to contact the first MEMS device 100a to determine the sheet resistance of the electrode(s) of the first MEMS device 100a. As shown in FIG. 2, the first pattern 108b of the second MEMS device 100b may include a clover pattern, and the first isolated area 104b of the second MEMS device 100b may include an unpatterned area with substantially uniform thickness.

Figure 3:
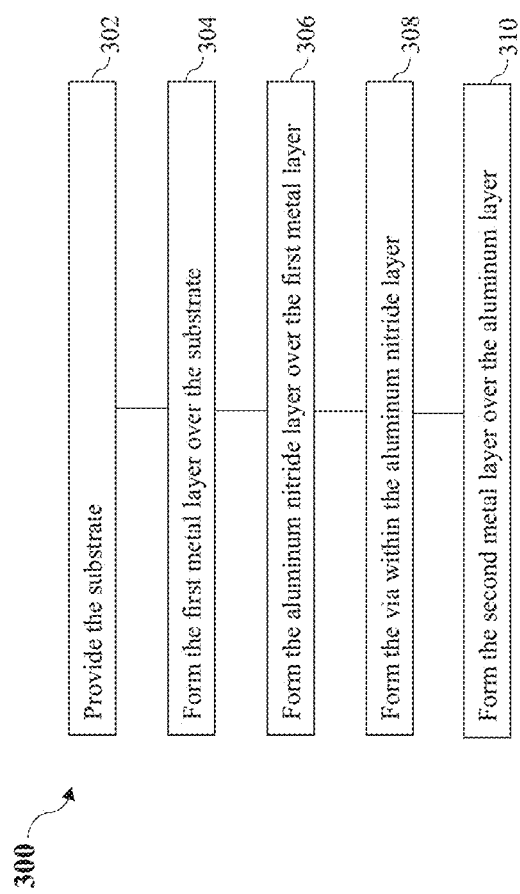
FIG. 3 shows a flow diagram of a method of forming the MEMS structure of FIG. 1.

FIG. 3 shows a flow diagram of a method 300 of forming the MEMS structure 100 according to various non-limiting embodiments.

The method 300 may include providing the substrate 102 (at 302), and forming the first metal layer 104 over the substrate 102 (at 304). In various non-limiting embodiments, forming the first metal layer 104 over the substrate 102 may further include depositing metal material over the substrate 102 and etching the metal material to form the first electrode area 104a and the isolated areas 104b, 104c of the first metal layer 104. The metal material may be etched by providing a mask over the metal material (where the mask may include at least one opening to expose a portion of the metal material), and removing the exposed portion of the metal material to form the first electrode area 104a and the isolated areas 104b, 104c.

The method 300 may further include forming the AlN layer 106 over the first metal layer 104 (at 306). In various non-limiting embodiments, the AlN layer 106 may be formed by depositing AlN over the first metal layer 104, such that a part of the AlN may be deposited between the first electrode area 104a and the first isolated area 104b, and between the isolated areas 104b, 104c. In some non-limiting embodiments, the AlN layer 106 may include further material, and the further material and the AlN may be simultaneously deposited over the first metal layer 104 using techniques, such as but not limited to sputter deposition, for example, alloy sputtering or co-sputtering.

The method 300 may further include forming the via 110 within the AlN layer 106 (at 308). In various non-limiting embodiments, the via 110 may be formed by etching a portion of the AlN layer 106 to form a hole through the AlN layer 106, and filling this hole with a conductive material.

The method 300 may further include forming the second metal layer 108 including the second electrode area 108a and the patterns 108b, 108 over the AlN layer 106 (at 310). Similar to the formation of the first metal layer 104, the second metal layer 108 may be formed by depositing metal material over the AlN layer 106 and etching the metal material using for example, a mask, to form the second electrode area 108a and the patterns 108b, 108c.

The above described order for the method is only intended to be illustrative, and the method is not limited to the above specifically described order unless otherwise specifically stated.

Figure 4:
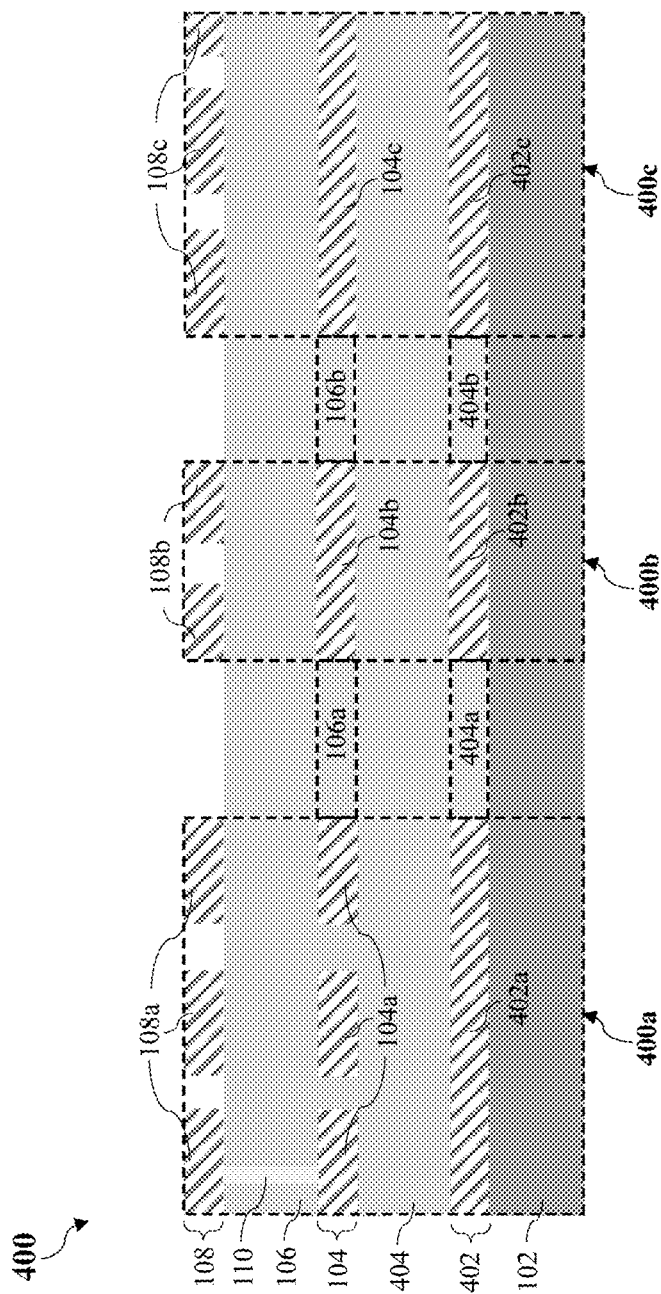
FIG. 4 shows a simplified cross-sectional view of a MEMS structure according to alternative non-limiting embodiments.

FIG. 4 shows a simplified cross-sectional view of a MEMS structure 400 according to alternative non-limiting embodiments. The MEMS structure 400 is similar to the MEMS structure 100, and thus, the common features are labelled with the same reference numerals and need not be discussed.

As compared to the MEMS structure 100, the MEMS structure 400 may further include a third metal layer 402 and an additional aluminum nitride (AlN) layer 404 arranged between the first metal layer 104 and the substrate 102. For example, in the non-limiting embodiment shown in FIG. 4, the third metal layer 402 may be arranged over the substrate 102 and the additional AlN layer 404 may be arranged over the third metal layer 402. In various non-limiting embodiments, the third metal layer 402 may include a metal material, such as but not limited to, molybdenum (Mo), platinum (Pt), titanium (Ti), alloys thereof, or combinations thereof. The first, second and third metal layers 104, 108, 402 may include a same metal material in some non-limiting embodiments or may include different metal materials in other non-limiting embodiments.

The third metal layer 402 may include one or more isolated areas, for example, a third isolated area 402a, a fourth isolated area 402b, and a fifth isolated area 402c as shown in the non-limiting embodiment in FIG. 4. The third, fourth and fifth isolated areas 402a, 402b, 402c may be configured to be electrically isolated from external electrical connection. Further, the additional AlN layer 404 may be arranged to extend between the isolated areas 402a, 402b, 402c to electrically isolate these isolated areas 402a, 402b, 402c from one another. For example, the additional AlN layer 402 may include a first portion 404a between the third and fourth isolated areas 402a, 402b, and a second portion 404b between the fourth and fifth isolated areas 402b, 402c.

One of the isolated areas (e.g. isolated area 402a) of the third metal layer 402 may at least partially overlap with at least one of the electrode areas (e.g. first electrode area 104a) of the first metal layer 104, and may also at least partially overlap with at least one of the electrode areas (e.g. second electrode area 108a) of the second metal layer 108. For example, in the non-limiting embodiment as shown in FIG. 4, the third isolated area 402a may completely overlap with the first electrode area 104a and also, with the second electrode area 108a. However, in alternative non-limiting embodiments, the third isolated area 402a may only partially overlap with the first and second electrode areas 104a, 108a. In some non-limiting embodiments, where the first and second electrode areas 104a, 108a may not completely overlap with each other, the third isolated area 402a may (either partially or completely) overlap with only one of these electrode areas 104a, 108a, and a further isolated area may be provided to (either partially or completely) overlap with the other electrode area 104a, 108a.

Further, at least one of the isolated areas (e.g. isolated areas 402b, 402c) of the third metal layer 402 may at least partially overlap with at least one of the isolated areas 104b, 104c of the first metal layer 104. For example, in the non-limiting embodiment in FIG. 4, the isolated areas 402b, 402c of the third metal layer 402 may completely overlap with the isolated areas 104b, 104c of the first metal layer 104 respectively. However, in alternative non-limiting embodiments, each of these isolated areas 402b, 402c of the third metal layer 402 may only partially overlap with the respective isolated area 104b, 104c of the first metal layer 104 over it.

As shown in FIG. 4, the first electrode area 104a, the second electrode area 108a, the via 110, the third isolated area 402a, a part of the AlN layer 106, a part of the additional AlN layer 404 and a part of the substrate 102 may form a first MEMS device 400a. The first and second electrode areas 104a, 108a of the first MEMS device 400a may respectively include top and bottom electrodes of the first MEMS device 400a. The fourth isolated area 402b, the first isolated area 104b, the first pattern 108b, a part of the AlN layer 106, a part of the additional AlN layer 404 and a part of the substrate 102 may form a second MEMS device 400b; whereas, the fifth isolated area 402c, the second isolated area 104c, the second pattern 108c, a part of the AlN layer 106, a part of the additional AlN layer 404 and a part of the substrate 102 may form a third MEMS device 400c. In various non-limiting embodiments, the first MEMS device 400a may be a piezoelectric device with the AlN layer 106 including scandium and being the piezoelectric layer that may vibrate in response to a high frequency electrical signal applied between the electrodes areas 104a, 108a. In various non-limiting embodiments, each of the second and third MEMS devices 400b, 400c may be configured to perform a different function from the first MEMS device 400a. For example, one or both of the second and third MEMS devices 400b, 400c may be electrical test devices configured to test the sheet resistance of the electrode(s) of the first MEMS device 400a. However, in alternative non-limiting embodiments, the first, second, and third MEMS devices may perform other functions, and the AlN layer 106 may include further material(s) that may improve the properties of the AlN layer 106 related to these functions.

Although the MEMS structure 400 of FIG. 4 shows three MEMS devices 400a, 400b, 400c, it is understood that the MEMS structure 400 may include only the first MEMS device 400a and only the second MEMS device 400b or only the third MEMS device 400c in alternative non-limiting embodiments. In some other alternative non-limiting embodiments, the MEMS structure 400 may include further MEMS devices. For example, the MEMS structure 400 may include at least one further MEMS device similar to the first MEMS device 400a, at least one further MEMS device similar to the second and third MEMS devices 400b, 400c and/or at least one further MEMS device which may also have a bottom electrode like the first MEMS device 400a but with the bottom electrode included in an electrode area of the third metal layer 402. In non-limiting embodiments where the MEMS structure 400 include electrode area(s) in the third metal layer 402, the isolated areas 402a, 402b, 402c may be configured to be electrically isolated from these electrode area(s), for example, by part of the additional AlN layer 404.

Figure 5:
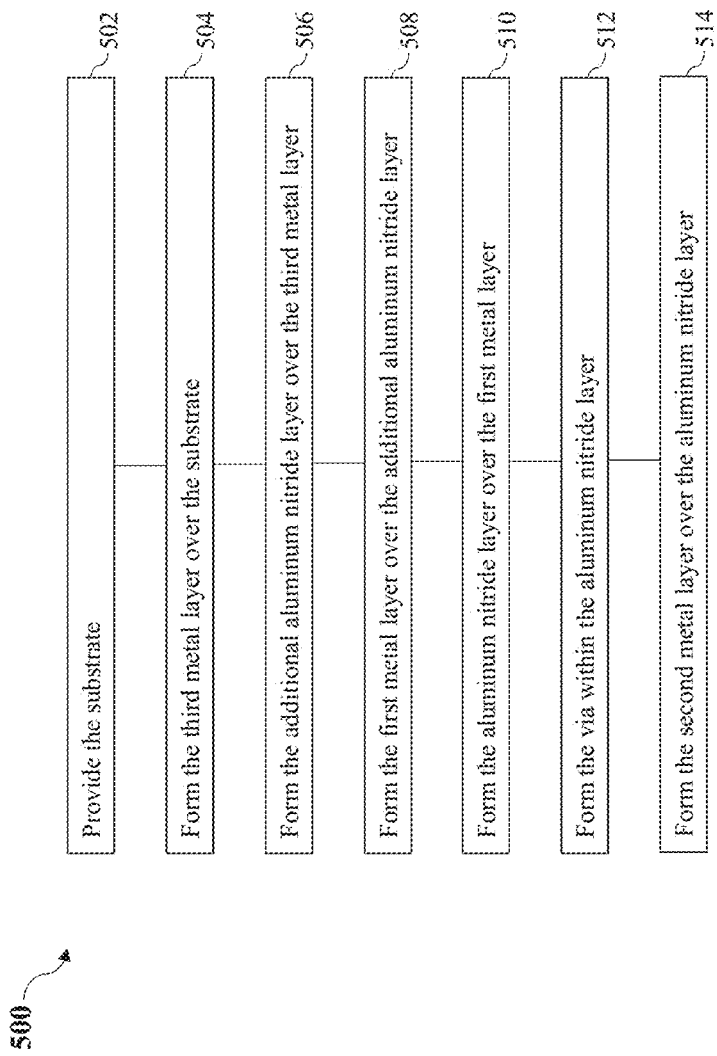
FIG. 5 shows a flow diagram of a method of forming the MEMS structure of FIG. 4.

FIG. 5 shows a flow diagram of a method 500 of forming the MEMS structure 400 according to various non-limiting embodiments.

The method 500 may include providing the substrate 102 (at 502), and forming the third metal layer 402 over the substrate 102 (at 504). The method 500 may further include forming the additional AlN layer 404 over the third metal layer 402 (at 506). In addition, the method may include forming the first metal layer 104 over the additional AlN layer 404 (at 508), forming the AlN layer 106 over the first metal layer 104 (at 510), forming the via 110 within the AlN layer 106 (at 512) and forming the second metal layer 108 over the AlN layer 106 (at 514). In various non-limiting embodiments, the metal layers 104, 108, 402 may be formed in a manner similar to that described for metal layers 104, 108 in 304, 310 of the method 300; whereas, the AlN layers 106, 404 may be formed in a manner similar to that described for the AlN layer 106 in 306 of the method 300. The via 110 may also be formed in a manner similar to that described for the via 110 in 308 of the method 300.

The above described order for the method is only intended to be illustrative, and the method is not limited to the above specifically described order unless otherwise specifically stated.

As described above, the MEMS structures 100, 400 in the various non-limiting embodiments may be fabricated with minimal additional layers and complexity, as compared to a typical process of fabricating MEMS structures. This is because deposition and etching of metal material over the substrate 102 are usually already performed in the typical process to form for example, bottom electrodes of devices. The methods for forming the MEMS structures 100, 400 in the various non-limiting embodiments may merely include further etching of the metal material over the substrate 102 to form the isolated areas 104b-104c, 402a-402c.

Further, in various non-limiting embodiments, for each pattern 108b, 108c or electrode area 108a of the top (second) metal layer 108, there may be provided a metal area (either in the form of an isolated area 104b-104c, 402a-402c or in the form of an electrode area 104a) at a corresponding location under each AlN layer 106, 404 below the top metal layer 108. This is such that each pattern 108b, 108c or electrode area 108a may at least partially overlap one or more metal areas 104a-104c, 402a-402c under each AlN layer 106, 404. This can help to reduce the density of defects in the AlN layers 106, 404 and the variations of the sheet resistances of the electrode areas 104a, 108a over the AlN layers 106, 404 may in turn be reduced. Accordingly, distortions in the patterns 108b, 108c and in the electrode area 108a (which may function as a top electrode of a MEMS device 100a, 400a) may be reduced. Hence, piezoelectric MEMS devices with the MEMS structures 100, 400 may use AlN layers 106, 404 with a higher concentration of scandium, without substantially increasing the distortion of the patterns 108b, 108c and the electrode area 108a of the top metal layer 108. As a result, such piezoelectric MEMS devices may have improved piezoelectric properties.

Although not shown in FIG. 1, one or more intermediate layers may be provided between the first metal layer 104 and the AlN layer 106 in some non-limiting embodiments. Similarly, although not shown in FIG. 4, one or more intermediate layers may be provided between the third metal layer 402 and the additional AlN layer 404 and/or between the first metal layer 104 and the AlN layer 106 in some non-limiting embodiments. The presence of these intermediate layers may not affect the ability of the isolated areas 104b-104c, 402a-402c to reduce defects in the AlN layers 106, 404.

Figure 6B:
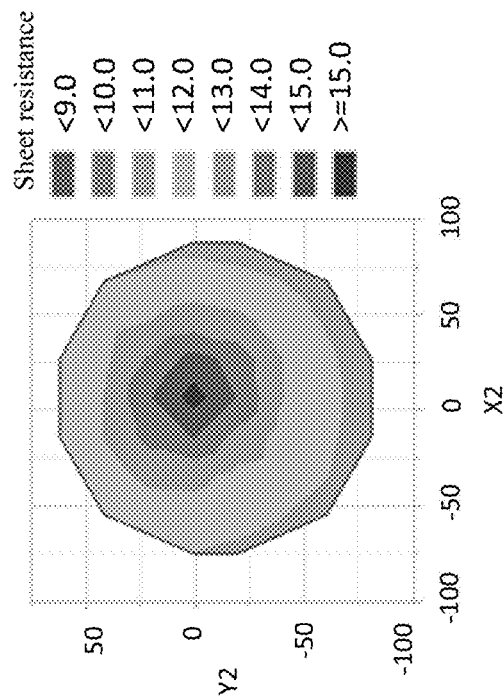
FIGS. 6A and 6B respectively show plots illustrating the sheet resistances of a metal layer of the MEMS structure of FIG. 4 and of a metal layer of a MEMS structure similar to the MEMS structure of FIG. 4, but without the isolated areas.
Figure 6A:
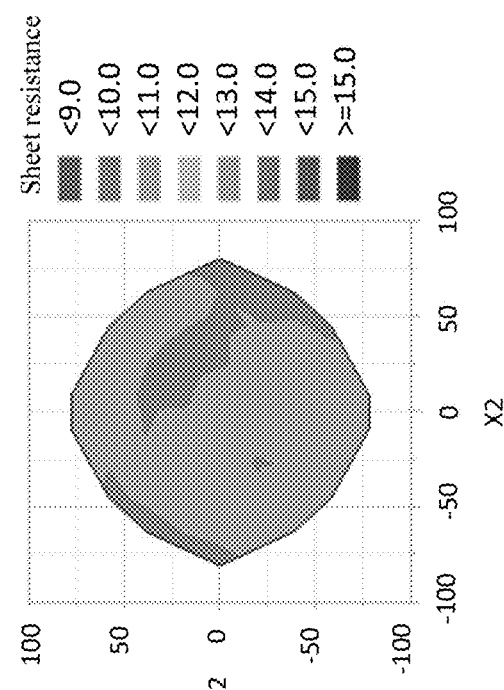

FIG. 6A shows a plot illustrating the sheet resistance of the second metal layer 108 of the MEMS structure 400 and FIGS. 7A to 7D show SEM images of the second metal layer 108 of the MEMS structure 400. FIG. 6B shows a plot illustrating the sheet resistance of the second metal layer 108 of a MEMS structure similar to that of the MEMS structure 400, but without the isolated areas 104b-104c, 402a-402c, and FIGS. 8A to 8D show SEM images of the second metal layer 108 of this MEMS structure. In particular, FIGS. 7A and 8A each shows the SEM image of a portion at a center of the respective second metal layer 108, FIGS. 7B and 8B each shows the SEM image of a portion at approximately 20 mm away from the center of the respective second metal layer 108, FIGS. 7C and 8C each shows the SEM image of a portion at approximately 40 mm away from the center of the respective second metal layer 108 and FIGS. 7D and 8D each shows the SEM image of a portion at approximately 60 mm away from the center of the respective second metal layer 108.

As shown in FIGS. 6B, and 8A to 8D, the variation of the sheet resistance of the second metal layer 108 in the absence of the isolated areas 104b-104c, 402a-402c is relatively high and the sheet resistance tends to increase towards the center of the second metal layer 108. The density of defects as shown in the SEM images of FIGS. 8A to 8D is also relatively high and similarly, tends to increase towards the center of the second metal layer 108. On the other hand, as shown in FIG. 6A, the sheet resistance of the second metal layer 108 when the isolated areas 104b-104c, 402a-402c are provided is much more uniform, and is relatively low especially in the proximity of the center of the layer 108.

Comparing FIGS. 8A to 8D with FIGS. 7A to 7D, it can also be seen that the density of defects in the second metal layer 108 with the isolated areas 104b-104c, 402a-402c is substantially lower than that without these isolated areas 104b-104c, 402a-402c.

Figure 9B:
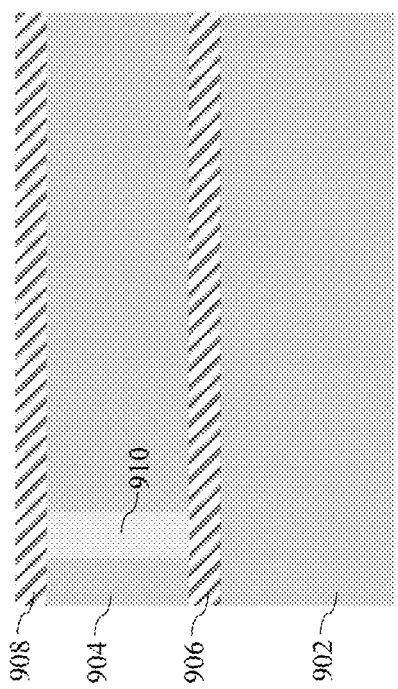
FIGS. 9A and 9B respectively show simplified cross-sectional views of a part of a prior art MEMS structure and a part of a MEMS structure according to various non-limiting embodiments.
Figure 9A:

FIG. 9A shows a simplified cross-sectional view of a part of a prior art MEMS structure 900. As shown in FIG. 9A, the prior art MEMS structure 900 may include a first AlN layer 902 and a second AlN layer 904. A first electrode area 906 may be arranged over the first AlN layer 902 and a second electrode area 908 may be arranged over the second AlN layer 904. The first electrode area 906 and the second electrode area 908 may be electrically connected by a via 910 extending through the second AlN layer 904.

FIG. 9B shows a simplified cross-sectional view of a part of a MEMS structure 912 according to various non-limiting embodiments. As shown, the MEMS structure 912 may also include first and second AlN layers 914, 916, and first and second electrode areas 918, 920 arranged over the first and second AlN layers 914, 916 respectively. The first and second electrode areas 918, 920 may also be electrically connected by a via 922 extending through the second AlN layer 916. However, the MEMS structure 912 may further include an electrically isolated metal area 924 arranged under the first AlN layer 914 and under the first and second electrode areas 918, 920. The electrically isolated metal area 924 may be similar to the isolated areas 104b, 104c of the MEMS structure 100 of FIG. 1.

Including the electrically isolated metal area 924 in the MEMS structure 912 may help to reduce the density of defects in the first and second AlN layers 914, 916 of this structure 912. In turn, the via 922 of the MEMS structure 912 may have a smoother surface as compared to the via 910 of the prior art MEMS structure 900. This is because each via 910/922 may be formed by first etching the respective second AlN layer 904/916 to remove a portion of the second AlN layer 904/916, and the etched portion of the second AlN layer 904/916 may then be filled with a metal material. When forming the via 910 in the prior art MEMS structure 900, it may be difficult to etch the defects in the second AlN layer 904 and thus, it may be difficult to completely remove the portion of the second AlN layer 904 to form the via 910. Accordingly, the resulting via 910 may have a generally rough surface and this may affect the electrical connection between the electrode areas 906, 908. On the other hand, the second AlN layer 916 of the MEMS structure 912 in various non-limiting embodiments may have a lower density of defects and may thus be more easily etched. Accordingly, a portion of the second AlN layer 916 may be more easily and thoroughly removed to form the via 922. The resulting via 922 may thus have a smoother surface and the electrical connection between the electrode areas 918, 920 may thus be improved.

The following examples pertain to further embodiments.

Example 1 may be a MEMS structure including: a substrate; a first metal layer arranged over the substrate, where the first metal layer may include an electrode area configured for external electrical connection and one or more isolated areas configured to be electrically isolated from the electrode area and further configured to be electrically isolated from external electrical connection; an aluminum nitride layer at least partially arranged over the first metal layer; and a second metal layer including one or more patterns arranged over the aluminum nitride layer, where each of the one or more patterns may be arranged to at least partially overlap with one of the one or more isolated areas.

In Example 2, the subject matter of Example 1 may optionally include that the MEMS structure may include a first MEMS device including the electrode area, where the electrode area may include a bottom electrode of the first MEMS device and the second metal layer may further include a top electrode of the first MEMS device arranged over the bottom electrode.

In Example 3, the subject matter of Example 1 may optionally include that the MEMS structure may further include an additional aluminum nitride layer; and a third metal layer; where the additional aluminum nitride layer and the third metal layer may be arranged between the first metal layer and the substrate, where the additional aluminum nitride layer may be arranged over the third metal layer; and where the third metal layer may include one or more isolated areas, where at least one of the one or more isolated areas of the third metal layer may at least partially overlap with at least one of the one or more isolated areas of the first metal layer.

In Example 4, the subject matter of Example 3 may optionally include that the MEMS structure may include a first MEMS device including the electrode area, where the electrode area may include a bottom electrode of the first MEMS device and the second metal layer may further include a top electrode of the first MEMS device arranged over the bottom electrode, where one of the one or more isolated areas of the third metal layer may at least partially overlap with at least one of the top electrode and the bottom electrode of the first MEMS device.

In Example 5, the subject matter of any one of Examples 1 to 4 may optionally include that at least one of the one or more isolated areas may have a substantially uniform thickness.

In Example 6, the subject matter of any one of Examples 1 to 4 may optionally include that at least one of the one or more isolated areas may include a pattern substantially similar to the pattern of the second metal layer at least partially overlapping with the isolated area.

In Example 7, the subject matter of any one of Examples 1 to 6 may optionally include that at least one of the one or more patterns of the second metal layer may be arranged to completely overlap with one of the one or more isolated areas.

In Example 8, the subject matter of Example 2 or Example 4 may optionally include that the MEMS structure may further include a second MEMS device including at least one of the one or more isolated areas, and where the second MEMS device may be configured to perform a different function from the first MEMS device.

In Example 9, the subject matter of Example 2 or Example 4 may optionally include that the top electrode and the bottom electrode of the first MEMS device may include substantially similar patterns.

In Example 10, the subject matter of Example 2 or Example 4 may optionally include that the first MEMS device may include a piezoelectric device.

In Example 11, the subject matter of any one of Examples 1 to 10 may optionally include that the aluminum nitride layer may include a material selected from a group comprising scandium, chromium, yttrium and combinations thereof.

In Example 12, the subject matter of any one of Examples 1 to 11 may optionally include that the aluminum nitride layer may be arranged to extend between at least one of the one or more isolated areas and the electrode area.

Example 13 may be a method of forming a MEMS structure, the method including: providing a substrate; forming a first metal layer over the substrate, where the first metal layer may include an electrode area configured for external electrical connection and one or more isolated areas configured to be electrically isolated from the electrode area and further configured to be electrically isolated from external electrical connection; forming an aluminum nitride layer at least partially over the first metal layer; and forming a second metal layer including one or more patterns over the aluminum nitride layer, where each of the one or more patterns may be arranged to at least partially overlap with one of the one or more isolated areas.

In Example 14, the subject matter of Example 13 may optionally include that forming the first metal layer over the substrate may include: depositing metal material over the substrate; and etching the metal material to form the electrode area and the one or more isolated areas of the first metal layer.

In Example 15, the subject matter of Example 14 may optionally include that etching the metal material may include: providing a mask over the metal material, where the mask may include at least one opening to expose a portion of the metal material; and removing the exposed portion of the metal material to form the electrode area and the one or more isolated areas of the first metal layer.

In Example 16, the subject matter of any one of Examples 13 to 15 may optionally include that the method may further include: forming a third metal layer over the substrate; forming an additional aluminum nitride layer over the third metal layer; where forming the first metal layer may include forming the first metal layer over the additional aluminum nitride layer; and where the third metal layer may include one or more isolated areas, at least one of the one or more isolated areas of the third metal layer at least partially overlapping with at least one of the one or more isolated areas of the first metal layer.

In Example 17, the subject matter of any one of Examples 13 to 16 may optionally include that the electrode area of the first metal layer may include a bottom electrode of a first MEMS device and the method may further include forming a top electrode of the first MEMS device on the second metal layer over the bottom electrode.

In Example 18, the subject matter of Example 17 may optionally include that at least one of the one or more isolated areas may be formed as part of a second MEMS device configured to perform a different function from the first MEMS device.

In Example 19, the subject matter of Example 17 or Example 18 may optionally include that the first MEMS device may include a piezoelectric device.

In Example 20, the subject matter of any one of Examples 13 to 19 may optionally include that the aluminum nitride layer may include a material selected from a group comprising scandium, chromium, yttrium and combinations thereof.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A microelectromechanical systems (MEMS) structure comprising:
  a substrate;
  a first metal layer arranged over the substrate, wherein the first metal layer comprises an electrode area configured for external electrical connection and one or more isolated areas configured to be electrically isolated from the electrode area and further configured to be electrically isolated from external electrical connection;
  an aluminum nitride layer at least partially arranged over the first metal layer; and
  a second metal layer comprising one or more patterns arranged over the aluminum nitride layer, wherein each of the one or more patterns is arranged to at least partially overlap with one of the one or more isolated areas;
  wherein the aluminum nitride layer is separated from a bottom surface of the first metal layer.

2. The MEMS structure of claim 1, wherein the MEMS structure comprises a first MEMS device including the electrode area, wherein the electrode area comprises a bottom electrode of the first MEMS device and the second metal layer further comprises a top electrode of the first MEMS device arranged over the bottom electrode.

3. The MEMS structure of claim 1, further comprising:
  an additional aluminum nitride layer; and
  a third metal layer;
  wherein the additional aluminum nitride layer and the third metal layer are arranged between the first metal layer and the substrate, wherein the additional aluminum nitride layer is arranged over the third metal layer; and
  wherein the third metal layer comprises one or more isolated areas, at least one of the one or more isolated areas of the third metal layer at least partially overlapping with at least one of the one or more isolated areas of the first metal layer.

4. The MEMS structure of claim 3, wherein the MEMS structure comprises a first MEMS device including the electrode area, wherein the electrode area comprises a bottom electrode of the first MEMS device and the second metal layer further comprises a top electrode of the first MEMS device arranged over the bottom electrode, wherein one of the one or more isolated areas of the third metal layer at least partially overlaps with at least one of the top electrode and the bottom electrode of the first MEMS device.

5. The MEMS structure of claim 1, wherein at least one of the one or more isolated areas has a substantially uniform thickness.

6. The MEMS structure of claim 1, wherein at least one of the one or more isolated areas comprises a pattern substantially similar to the pattern of the second metal layer at least partially overlapping with the isolated area.

7. The MEMS structure of claim 1, wherein at least one of the one or more patterns of the second metal layer is arranged to completely overlap with one of the one or more isolated areas.

8. The MEMS structure of claim 2, wherein the MEMS structure further comprises a second MEMS device including at least one of the one or more isolated areas, and wherein the second MEMS device is configured to perform a different function from the first MEMS device.

9. The MEMS structure of claim 2, wherein the top electrode and the bottom electrode of the first MEMS device comprise substantially similar patterns.

10. The MEMS structure of claim 2, wherein the first MEMS device comprises a piezoelectric device.

11. The MEMS structure of claim 1, wherein the aluminum nitride layer comprises a material selected from a group comprising scandium, chromium, yttrium and combinations thereof.

12. The MEMS structure of claim 1, wherein the aluminum nitride layer is arranged to extend between at least one of the one or more isolated areas and the electrode area.

13. A method of forming a MEMS structure, the method comprising:
providing a substrate;
forming a first metal layer over the substrate, wherein the first metal layer comprises an electrode area configured for external electrical connection and one or more isolated areas configured to be electrically isolated from the electrode area and further configured to be electrically isolated from external electrical connection;
forming an aluminum nitride layer at least partially over the first metal layer, wherein the aluminum nitride layer is separated from a bottom surface of the first metal layer; and
forming a second metal layer comprising one or more patterns over the aluminum nitride layer, wherein each of the one or more patterns is arranged to at least partially overlap with one of the one or more isolated areas.

14. The method of claim 13, wherein forming the first metal layer over the substrate comprises:
depositing metal material over the substrate; and
etching the metal material to form the electrode area and the one or more isolated areas of the first metal layer.

15. The method of claim 14, wherein etching the metal material comprises:
providing a mask over the metal material, wherein the mask comprises at least one opening to expose a portion of the metal material; and
removing the exposed portion of the metal material to form the electrode area and the one or more isolated areas of the first metal layer.

16. The method of claim 13, further comprising:
forming a third metal layer over the substrate;
forming an additional aluminum nitride layer over the third metal layer;
wherein forming the first metal layer comprises forming the first metal layer over the additional aluminum nitride layer; and
wherein the third metal layer comprises one or more isolated areas, at least one of the one or more isolated areas of the third metal layer at least partially overlapping with at least one of the one or more isolated areas of the first metal layer.

17. The method of claim 13, wherein the electrode area of the first metal layer comprises a bottom electrode of a first MEMS device and the method further comprises forming a top electrode of the first MEMS device on the second metal layer over the bottom electrode.

18. The method of claim 17, wherein at least one of the one or more isolated areas is formed as part of a second MEMS device configured to perform a different function from the first MEMS device.

19. The method of claim 17, wherein the first MEMS device comprises a piezoelectric device.

20. The method of claim 13, wherein the aluminum nitride layer comprises a material selected from a group comprising scandium, chromium, yttrium and combinations thereof.

* * * * *